US006580332B2

(12) United States Patent
Sutliff et al.

(10) Patent No.: US 6,580,332 B2
(45) Date of Patent: Jun. 17, 2003

(54) DUAL-FUNCTION CONNECTION PADS FOR TCXO INTEGRATED CIRCUIT

(75) Inventors: Richard N. Sutliff, South Elgin, IL (US); Iyad Alhayek, Schaumburg, IL (US); Ammar Yasser Rathore, Bloomingdale, IL (US); Jaroslaw Adamski, Streamwood, IL (US)

(73) Assignee: CTS Corporation, Elkhart, IN (US)

( * ) Notice: Subject to any disclaimer, the term of this patent is extended or adjusted under 35 U.S.C. 154(b) by 49 days.

(21) Appl. No.: 09/734,334

(22) Filed: Nov. 30, 2000

(65) Prior Publication Data

US 2002/0063608 A1 May 30, 2002

(51) Int. Cl.[7] .................................................. H03B 5/12
(52) U.S. Cl. .................. 331/158; 331/66; 331/116 FE; 331/176; 331/158
(58) Field of Search ........................ 331/158, 66, 116 R, 331/177 V, 36 C, 74, 108 D, 116 FE, 176; 326/37, 38

(56) References Cited

U.S. PATENT DOCUMENTS

| 5,405,476 A | 4/1995 | Knecht .................. 310/348 X |
| 5,428,319 A | 6/1995 | Marvin et al. .............. 331/176 |
| 5,438,219 A | 8/1995 | Kotzan et al. .............. 257/469 |
| 5,446,954 A | 9/1995 | Knecht et al. .......... 310/315 X |
| 5,459,436 A | 10/1995 | Pucci et al. .................... 331/66 |
| 5,481,229 A | 1/1996 | Connell et al. ............. 331/158 |
| 5,500,628 A | 3/1996 | Knecht ........................ 331/68 |
| 5,659,270 A | 8/1997 | Millen et al. ................. 331/69 |
| 5,668,506 A | 9/1997 | Watanabe et al. ............. 331/66 |
| 5,724,009 A | 3/1998 | Collins et al. .......... 331/108 C |
| 5,731,742 A | 3/1998 | Wojewoda et al. ........... 331/44 |
| 5,760,656 A | 6/1998 | Sutliff et al. ............ 331/116 R |
| 5,777,524 A | 7/1998 | Wojewoda et al. ..... 331/116 R |

Primary Examiner—Arnold Kinkead
(74) Attorney, Agent, or Firm—John P. Christensen; Steven Weseman

(57) ABSTRACT

A method and apparatus are provided for constructing a temperature controlled crystal oscillator chip. The method includes the steps of disposing a connection pad on a surface of the chip, providing a first circuit within the chip for control of a first chip function through a first interconnection with the connection pad and providing a second circuit within the chip for control of a second chip function, unrelated to the first chip function, through a second interconnection with the connection pad.

21 Claims, 7 Drawing Sheets

DUAL-FUNCTION CONNECTION PADS FOR TCXO INTEGRATED CIRCUIT

FIELD OF THE INVENTION

The field of the invention relates to oscillators and more particularly to temperature controlled crystal oscillators.

BACKGROUND OF THE INVENTION

For generating frequency reference signals in radio telephones and pagers, quartz crystal based oscillators predominate. Quartz crystal resonators offer several comparative advantages; they are inert, relatively power efficient, frequency stable and size scalable. However advantageous, crystal resonators present some practical problems. When quartz crystal is manufactured in an economical manner, its resonant frequencies cannot be predicted (or controlled) with an accuracy sufficient for many applications. Furthermore, the oscillating frequency of known quartz crystals is temperature dependant—the sensitivity varying according to crystal cut and crystal quality generally.

Accordingly, crystal oscillator circuits are both factory tuned to account for manufacturing variances and also equipped with features for temperature compensation. In the basic circuit design, an inverter and biasing resistor are each connected in parallel with the crystal resonator. The inverter and biasing resistor serve to start and then maintain the oscillation. An adjustable capacitance element such as a varactor or switched capacitor arrays are connected to the quartz crystal to allow frequency adjustment for factory tuning and temperature compensation. A voltage responsive temperature sensing element is scaled and operably connected to the adjustable capacitance element to provide temperature compensation of the oscillator frequency.

This frequency adjustment is conventionally called "warping" or "pulling," labels which reflect the relative difficulty in changing the frequency of crystal-based oscillators. Although such crystal-based oscillator circuits have received widespread commercial acceptance, efforts at improvement on this basic design continued.

In the interest of allowing wireless communication providers to provide additional service, governments worldwide have allocated new higher RF frequencies for commercial use. To better exploit these newly allocated frequencies, standard setting organizations have adopted bandwith specifications with compressed transmit and receive bands as well as individual channels. These trends are pushing the limits of oscillator technology to provide sufficient frequency selectivity.

Coupled with the tighter frequency control requirements are the consumer market trends towards ever smaller wireless communication devices (.e.g. handsets) and longer battery life. Combined, these trends place difficult constraints on the design of wireless components such as oscillators. Oscillator designers may not simply add more space-taking components or increase power dissipation in order to provide improved accuracy and stability.

Therefore, the need continues for improved oscillators which can offer frequency selectivity, size reduction and other performance improvements.

SUMMARY

A method and apparatus are provided for constructing a temperature controlled crystal oscillator chip. The method includes the steps of disposing a connection pad on a surface of the chip, providing a first circuit within the chip for control of a first chip function through a first interconnection with the connection pad and providing a second circuit within the chip for control of a second chip function, unrelated to the first chip function, through a second interconnection with the connection pad.

DETAILED DESCRIPTION OF A PREFERRED EMBODIMENT

A temperature controlled crystal oscillators (TCXOs) is constructed in the form of a crystal and a controlling chip. Within the chip, an array of switchable capacitors (or an integrated varactor) and a feedback amplifier form a tank circuit that oscillates at a frequency determined by the number of capacitors switched into the tank circuit (or varactor control voltage). An internal power supply functions to drive the tank circuit at the predetermined frequency.

A temperature sensor is provided within the chip for sensing a temperature in the environs of the crystal. Based upon the temperature, a controller switches capacitors into and out of the tank circuit based upon a performance criteria of the tank circuit which are stored in a lookup table within the TCXO chip. Alternatively, a controller adjusts the varactor bias of the tank circuit based upon a performance criteria of the tank circuit using bias values stored in a lookup table within the TCXO chip.

Figure 1:
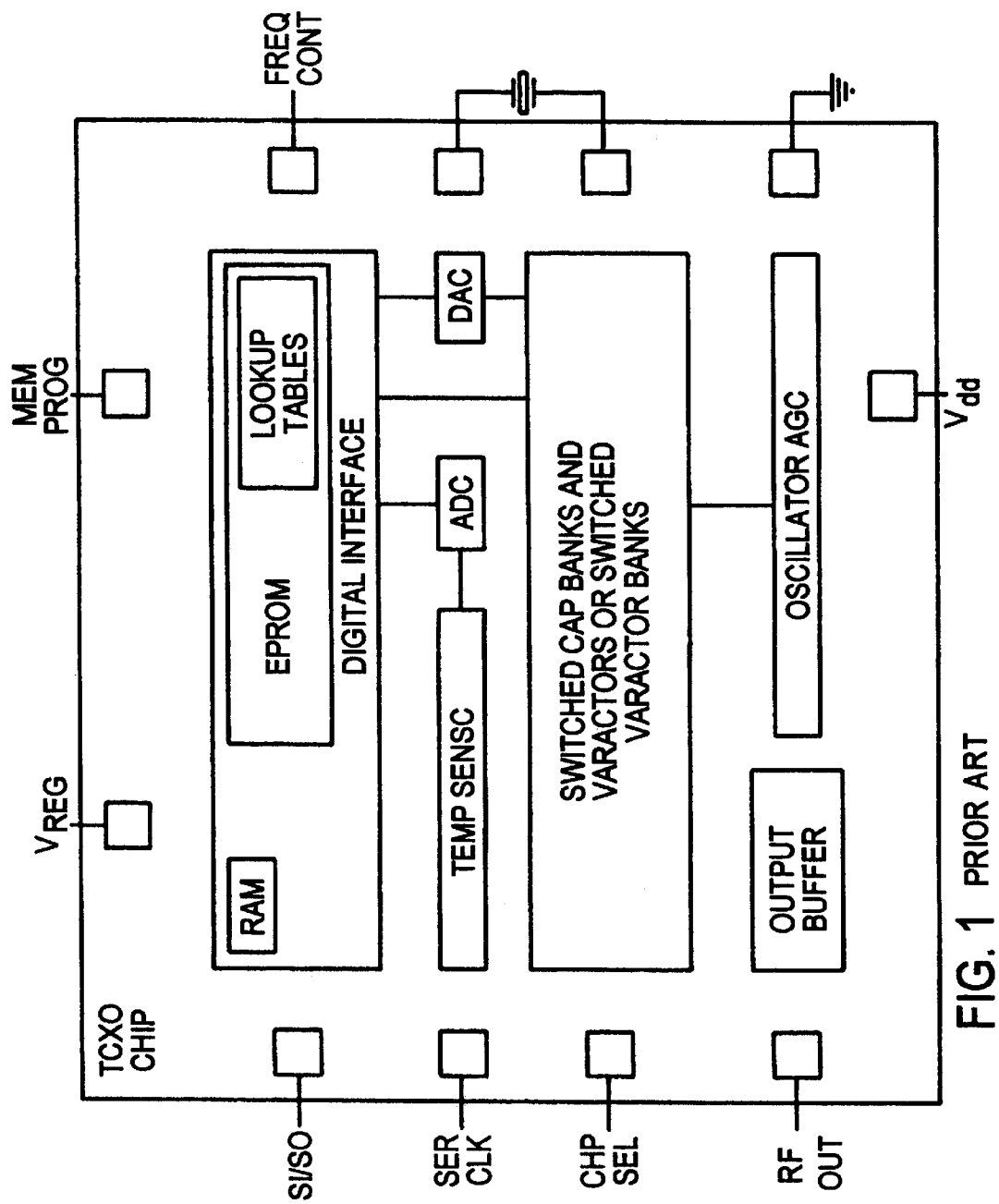
FIG. 1 is a block diagram of a TCXO showing an external pad layout under the prior art and internal circuitry used by illustrated embodiments of the invention.

FIG. 1 is a block diagram of a TCXO. The connection pad layout of FIG. 1 may be considered exemplary of prior art use. The internal circuitry of FIG. 1 illustrates the functionality of the prior art and also of illustrated embodiments of the invention. As shown, a first set of terminals may be provided for connection of a crystal oscillator. Another set of terminals ($V_{dd}$, GRND) may be provided to supply power to the TCXO. A radio frequency output ($RF_{out}$) is provided to transfer an output frequency of the TCXO to external circuitry (not shown). A frequency control input (FREQ CONT) is provided to allow for minor adjustments of an output frequency of the TCXO to accommodate long term effects of aging as well as to provide means to lock the oscillator to a desired frequency. A power supply output connection ($V_{REG}$) is provided for connection to an external capacitor to stabilize an internal power supply.

The TCXO of FIG. 1 also includes program inputs (i.e., MEM PROG, SI, SO, SCK and CHP SEL). The program inputs allow for factory control of TCXO operating parameters. The input MEM PROG allows a relatively high voltage (e.g., 14 volts) to be provided to program an internal electrically programmable read only memory (EPROM). A chip select (CHP SEL) allows a particular chip to be selected for programming. A serial clock (SCK) connection allows an internal clock of the TCXO to be synchronized for data transfer. A serial data port (SI/SO) provides a path for reading data into and out of the chip.

In general TCXOs are fabricated for a particular operating frequency. Once fabricated, the TCXO chip may be calibrated for use. An external calibration device (not shown) may download a calibration program to a random access memory (RAM) of the TCXO chip. The downloaded calibration program may switch capacitors into the tank circuit of the TCXO while an external frequency output of the TCXO is precisely measured at the $Rf_{out}$. A temperature output of an internal temperature sensor may be measured and compared with frequency drift based upon temperature.

A predetermined voltage range may be applied to the FREQ CONT input and a frequency change on $RF_{out}$ may be measured. A multiplier may be calculated for the FREQ CONT inputs and loaded into the lookup tables as a separate table of calibration values. Based upon the calibration values, a calibrated set of operating parameter may be programmed into a set of lookup tables within an EPROM of the TCXO.

In operation, the effects of the internal temperature compensation on output frequency are mixed with any desired adjustments made at the external FREQ CONT.

As is preferred, however, factory temperature calibration is performed by fixing FREQ CONT voltage and then controllably subjecting the TCXO to a range of temperatures. For a set of different temperature points, the appropriate adjustment to the variable capacitance element (switched capacitor arrays and/or varactor) in determined. The appropriate setting for each temperature is then stored (or downloaded) in a lookup table within an EPRO of the TCXO.

To download the operating parameters, a serial clock may be applied to the TCXO chip on the SCK pad along with a chip select code on the CHP SEL pad. The calibration program may be downloaded through the SI pad. Measured parameters (e.g., from the temperature sensor) may be uploaded to the external calibration device through the SO pad. The downloaded calibration may be programmed into the lookup tables of the EPROM based upon an EPROM programming voltage provided through the MEM PROG pad.

Described below is a novel method and apparatus which allows for a significant reduction in the size of TCXOs. The reduction in size may be accomplished by replacing the single-function pads on the exterior surface of the TOXO chip of FIG. 1 with one or more multi-function connection pads and by changes to the internal circuitry shown in FIG. 1.

Figure 2:
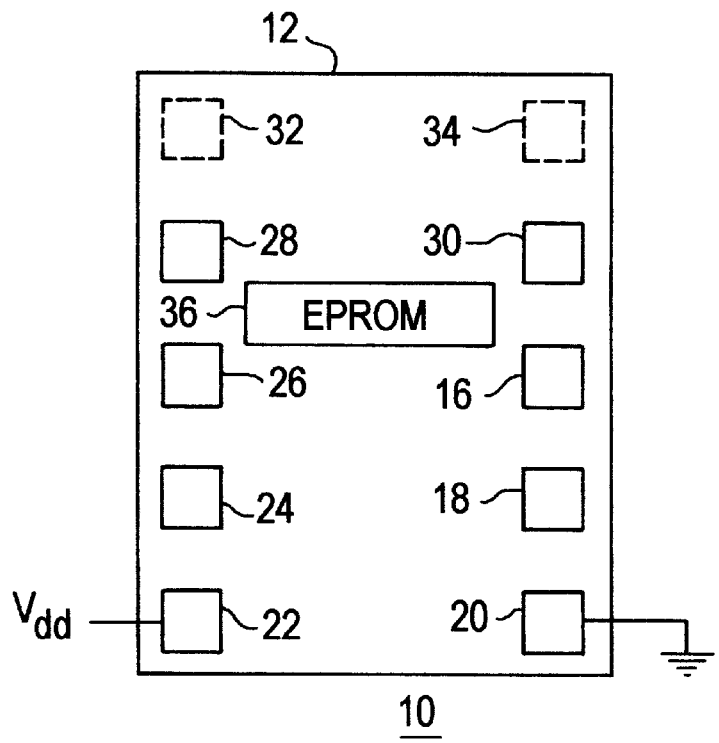
FIG. 2 is a generalized block diagram of a TCXO connection pad layout under an illustrated embodiment of the invention.

FIG. 2 depicts a TCXO 10 shown generally under an illustrated embodiment of the invention. As shown, a first set of single-function terminals 16, 20, 22 may be provided for connection with an external crystal 14 and power source. A second set of multi-function terminals 18, 24, 26, 28, 30, 32, 34 are provided for control of the TCXO 10 as described in more detail below.

Figure 3:
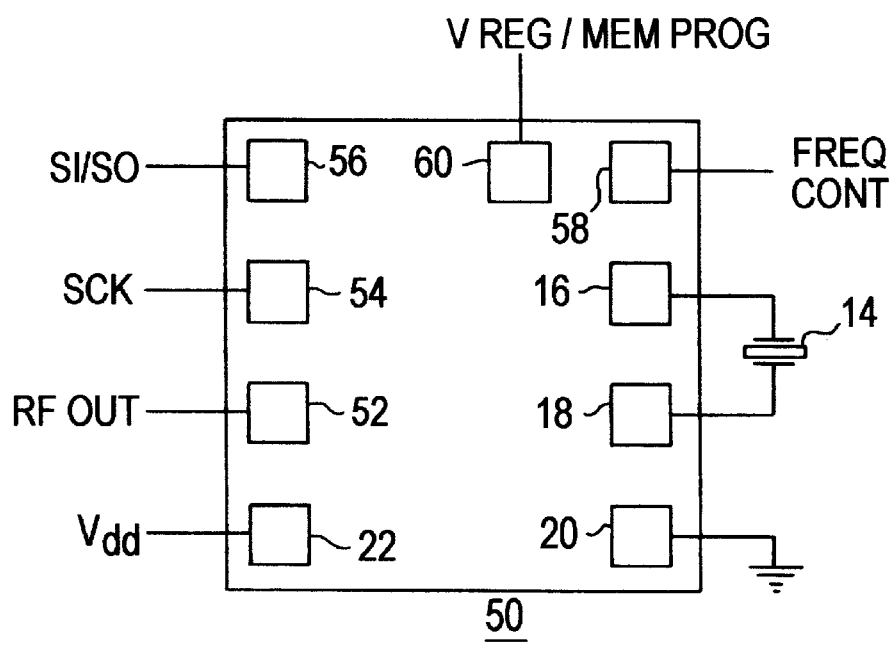
FIG. 3 is a specific example of the TCXO of FIG. 2.

FIG. 3 is a specific illustrated embodiment of the chip 10 of FIG. 2. Under the illustrated embodiment of FIG. 3, the chip 50 is provided with a single multi-function connection pad 60 and a series of single-function pads 16, 18, 20, 22, 52, 54, 56, 58.

Figure 4:
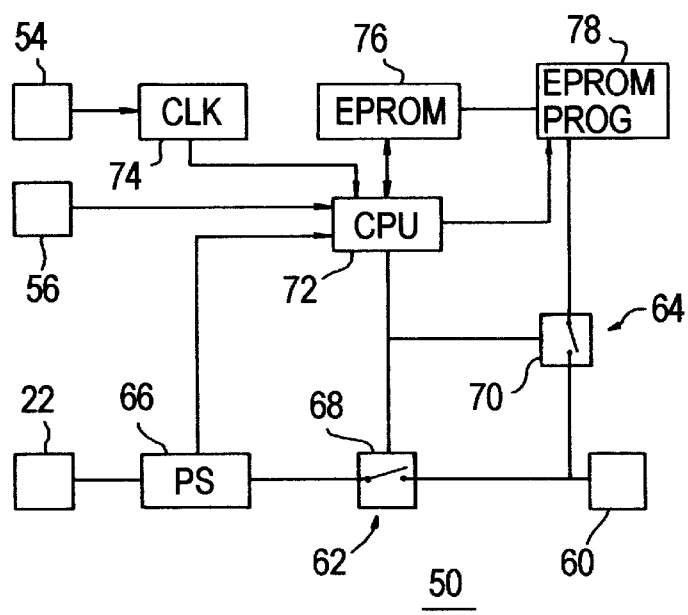
FIG. 4 is a schematic of the TCXO of FIG. 3.

FIG. 4 depicts simplified programming circuitry within the TCXO 50 associated with the multi-function connection pad 60. Shown in FIG. 4 is a first circuit 62 which allows the pad 60 to serve a first chip function (e.g., connection of an external capacitor for purposes of filtering an internal power supply). Also shown in FIG. 4 is a second circuit 64 which allows the pad 60 to serve a second chip function (e.g., for connection of an external high voltage power supply).

To serve the first and second chip functions, appropriate programming instructions may be independently downloaded over the serial data connection 56 into a central processing unit 72. During normal operation when the TCXO 50 is used as a frequency source (e.g., in a cellular radio), a switch 68 of the first circuit 62 may be closed and the pad 60 may serve as a connection for power supply regulation. To allow for power supply regulation, an external capacitor (not shown) may be connected between the pad 60 and ground.

Alternatively, the pad 60 may be used to supply a high voltage (e.g., 14 volts) to an EPROM programmer (EPROM PROG) 78 (e.g., a matrix switch). In order to program the EPROM 76, the CPU 72 may open the switch 68 of the first circuit 62 and close a switch 70 of the second circuit. An external high voltage power supply (not shown) may then be connected between the pad 60 and ground. A potential from the high voltage power supply may then be used to program the EPROM 76 through the EPROM CONT 78.

Programming instructions for the EPROM PROG 78 may be downloaded to the CPU 72 through the serial interface 56. Operating under the downloaded instructions, the EPROM 76 may be programmed by the EPROM PROG 78 under control of the CPU 72 using the high voltage provided through the second circuit 64 using methods well known in the art.

Figure 5:
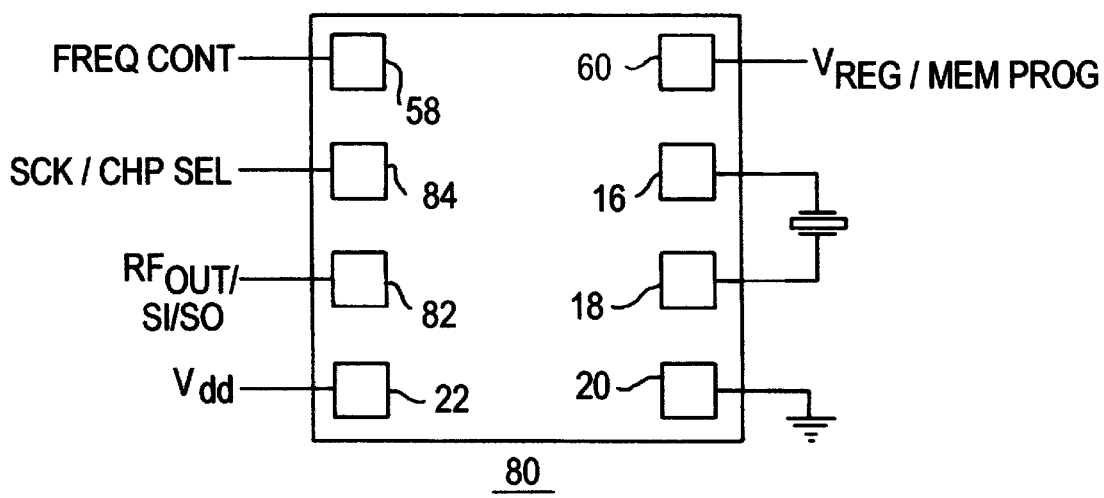
FIG. 5 is a specific example of the TCXO of FIG. 2.

FIG. 5 illustrates another example of the use of the multi-function pads of FIG. 2. As shown in FIG. 5, connection pad 82 may be used as a serial data connection and also as an $RF_{OUT}$ connection to route an output of the TCXO 80 to external circuits. A second multifunction pad 84 combines chip selection with a clock input.

Figure 6:
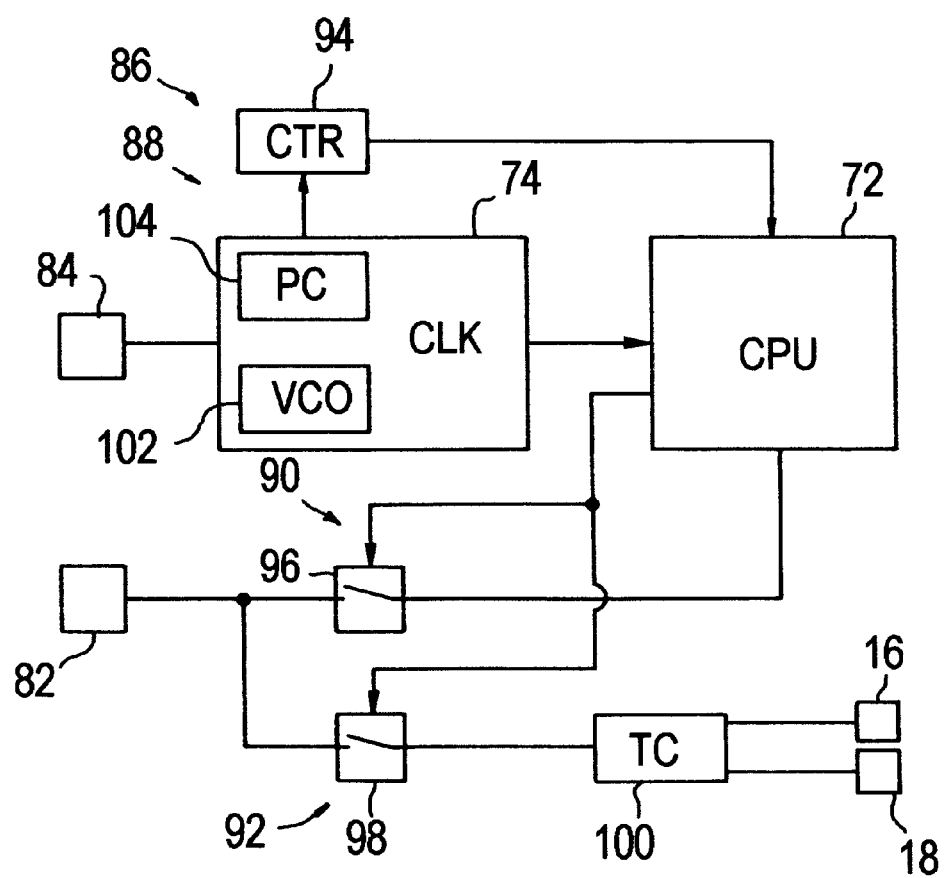
FIG. 6 is a schematic of the TCXO of FIG. 5.

FIG. 6 shows internal circuitry of the TCXO 80 associated with each of the multi-function pads 82, 84. As shown, a first circuit 88 allows the internal clock 74 to be synchronized with an external clock signal arriving through pad 84. A second circuit 86 allows the external clock signal to be used as a chip select.

Synchronization of the internal clock received through the pad 84 may be accomplished by comparing the received clock SCK with an output of a voltage controlled oscillator (VCO) 102 within a phase comparator (PC) 104. A phase difference detected by the PC 104 may be used to adjust an output of the VCO 102 to synchronize with the received clock.

Chip selection may be accomplished within the second circuit 86 by counting clock pulses. Since a clock signal would not normally be present upon the pad 84, the detection of a predetermined number of clock pulses may be used to alert the CPU 72 to an access request from external circuitry.

Once an alert has been detected from the external circuitry, the second multi-function pad 82 may be used to input/output data. During normal operating conditions, (i.e., the TCXO is generating an output frequency), a first circuit 92 couples the output frequency to the pad 82 through a first switch 98. When an access request is detected by the CPU 72, the CPU 72 opens the switch 98 of the first circuit 92 and closes a second switch 96 of a second circuit 90. Opening the first switch 98 disconnects the tank circuit (TC) 100 and connects the pad 82 to a communications port of the CPU 72.

To initiate an access request, the external circuitry may generate a predetermined number of clock pulses (e.g., 17)

on the CLK/CHP SEL pad 84. A counter (CTR) 94 may be used to count pulses. When the predetermined number has been reached, the CTR 94 may transfer an access alert to the CPU 72.

In response, the CPU 72 may open switch 98 and close switch 96. The external circuitry may then transfer data into the CPU 72 or request data from the CPU 72.

Figure 7:
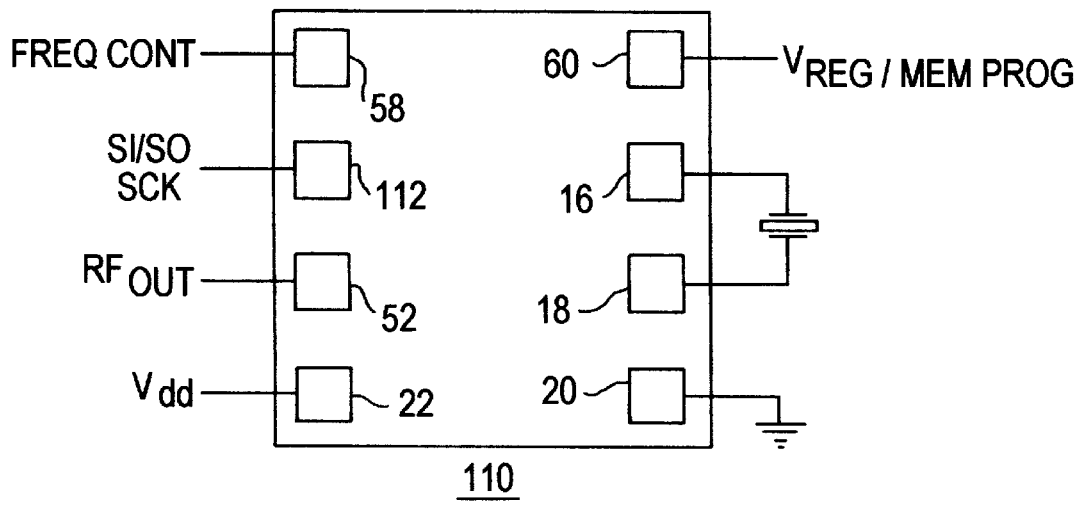
FIG. 7 is a specific example of the TCXO of FIG. 2.

FIG. 7 depicts another use of the multi-function pads of FIG. 2. In FIG. 7, a multi-function pad 112 may be used for SCK, SI, SO.

Figure 8:
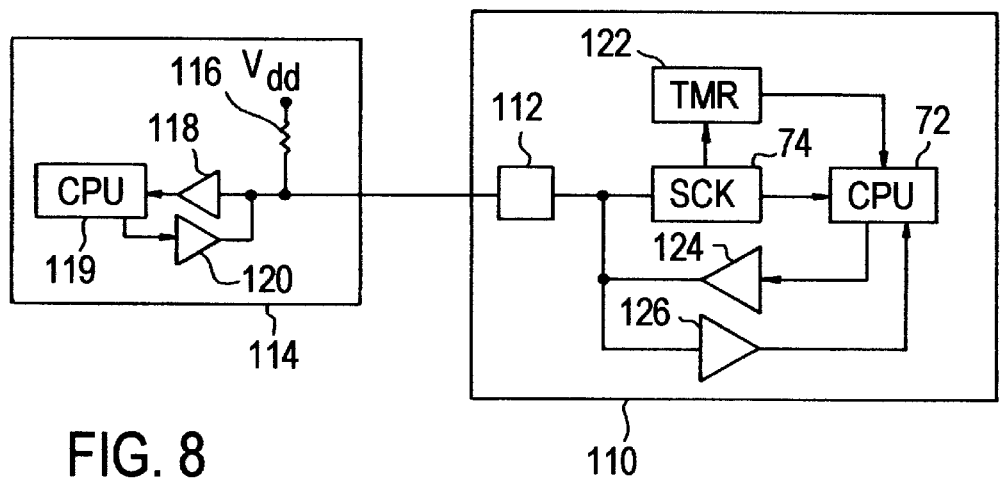
FIG. 8 is a schematic of the TCXO of FIG. 5.
Figure 9:
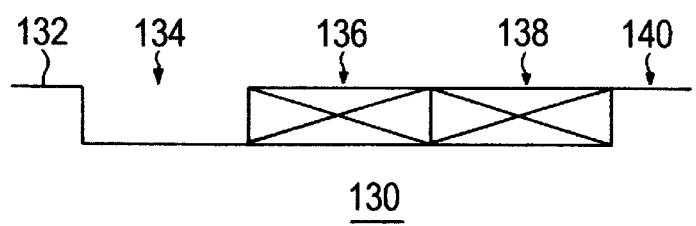
FIG. 9 is a timing diagram that may be used by the circuitry of FIG. 8.

FIG. 8 depicts a micro-local area network (microLAN) that may be used in support of the SCK/SI/SO pad 112. FIG. 9 depicts a microLAN protocol used with the network of FIG. 8.

As shown in FIG. 9, a communications session may be initiated by external circuitry 114 by imposing a reset pulse 134 of a predetermined length (e.g., 500 milliseconds). Following the reset pulse 134, a first predetermined period 136 may be reserved for serial inbound (SI) data. A second predetermined period 138 may be reserved for serial outbound (SO) data.

To initiate a communications session, a CPU 119 of external circuitry 114 pulls the bus (i.e., pad 112) low for the reset pulse 134. Following the reset pulse 134, the CPU 119 may transmit any SI data during the first period 136 using a driver 120.

The clock 74 detects a SCK during a first period 132 followed by the reset pulse 134. A timer (TMR) 122 detects the reset pulse and alerts the CPU 72. The CPU 72 detects the SI data through amplifier 126.

Following the first predetermined period 136, the CPU 119 releases the bus. A pull-up resistor 116 allows the bus to float to $V_{dd}$.

During the second predetermined period 138, the CPU 72 may transmit SO data. The CPU 72 transmits SO data through the outbound amplifier 124. The outbound amplifier may transmit data bits by rapidly pulling the bus low in synchronism with the data stream by sinking more current than can be supplied by the pull-up resistor 116. The SO data is detected by the inbound amplifier 118 and transferred to the CPU 119.

Figure 10:
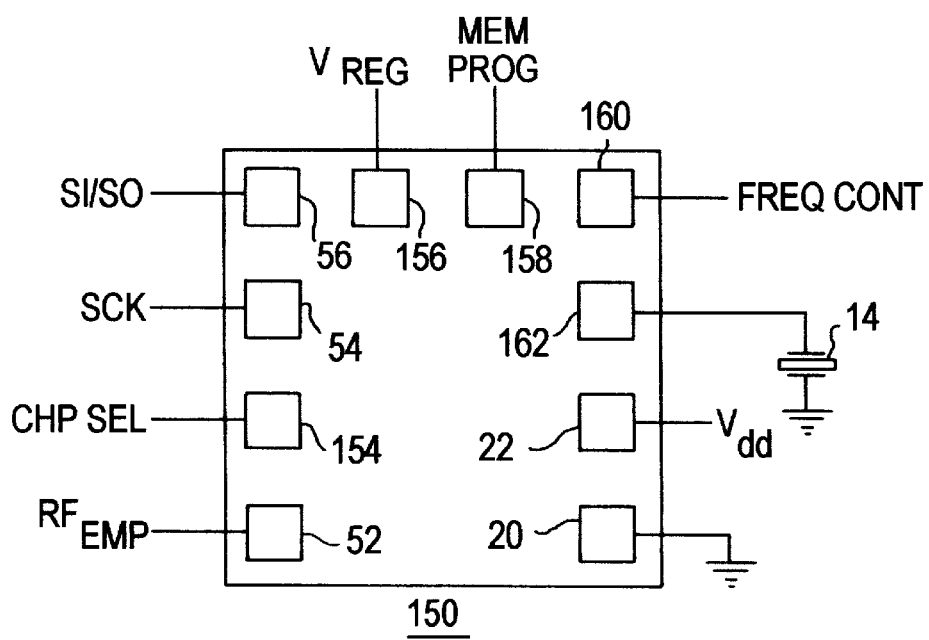
FIG. 10 is a specific example of the TCXO of FIG. 2.

FIG. 10 is another specific illustrated embodiment of the chip 10 of FIG. 2. Under the illustrated embodiment of FIG. 10, the chip 150 is provided with a pair of multi-function connection pad 160, 162 and a number of single function pads 20, 22, 52, 54, 56, 154, 156, 158. A first multi-function pad 160 allows for frequency control adjustments (e.g., 10 parts per million (ppm)) and a second multifunction pad 162 provides a connection for a first end of the crystal oscillator 14.

Figure 11:
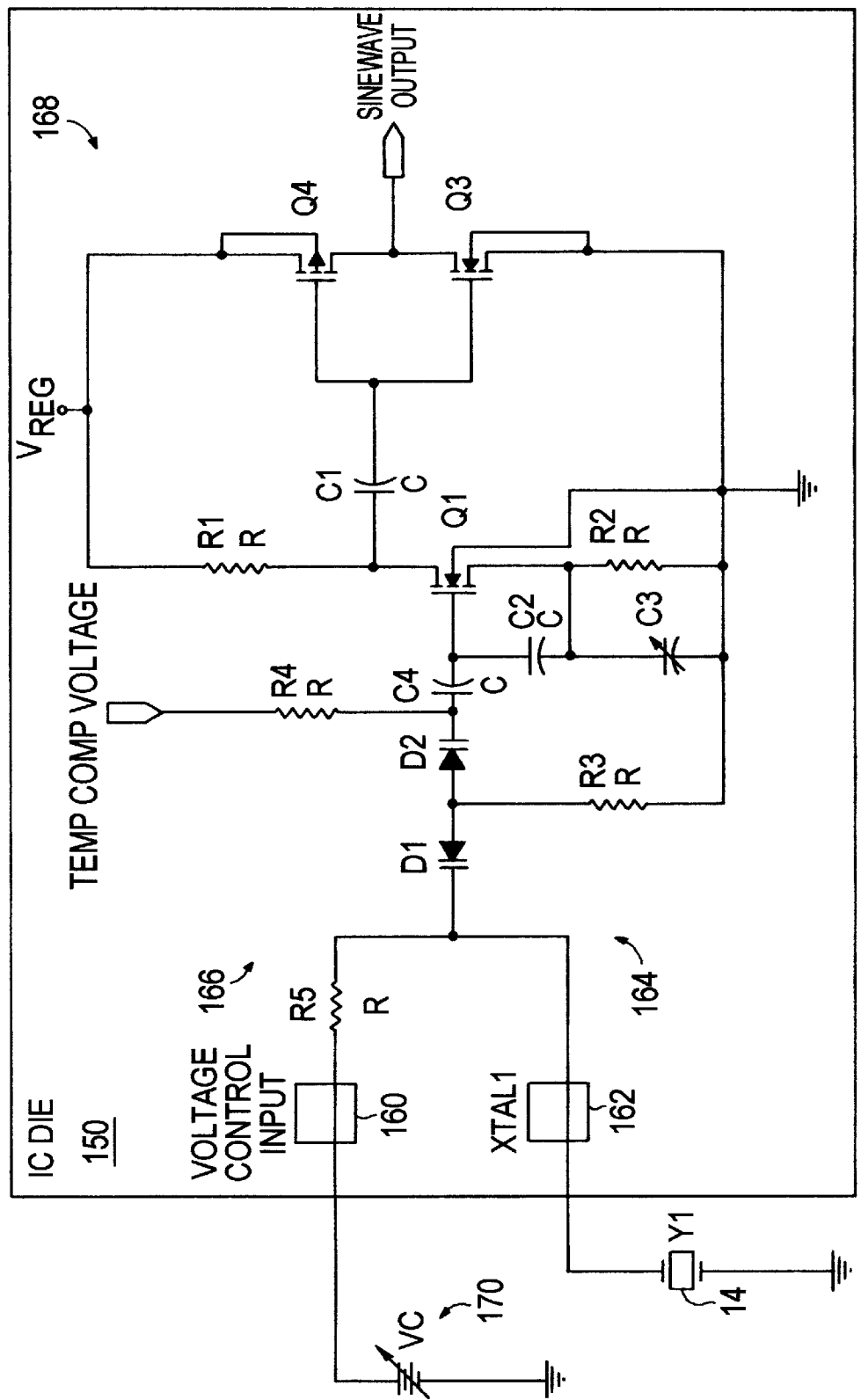
FIG. 11 is a schematic of the TCXO of FIG. 10.

FIG. 11 depicts simplified circuitry within the TCX) 150 that may be associated with the multi-function pads 160, 162. Shown in FIG. 11 is a first circuit 164 and a second circuit 166 that share the multi-function connection pads 160, 162.

Pads 160, 162 are multi-function in the sense that they eliminate the need for coupling both sides of the crystal oscillator 14 to the chip 150. The elimination of the need for coupling both sides of the oscillator 14 to the chip 150 is achieved through the use of Colpitts circuit 168.

As shown in FIG. 11, the variable power supply 170 provides a variable potential source to the crystal 14 through the first circuit 166. The variable potential from the variable power supply 170 allows the crystal oscillator 14 to oscillate in a very stable environment through the interaction of the first and second circuits 164, 166 and influence of the Colpitts circuit 168.

FIGS. 3–11 offer a number of examples of the use of multi-function connector pads for a TCXO. The examples have been simplified and for ease of understanding offered in the context where a small number of multi-function pads are used at a time. It should be understood, however, that any combination of some or all of the described multi-function pads could be implemented with any particular TCXO.

A specific embodiment of a method and apparatus for providing a TCXO according to the present invention has been described for the purpose of illustrating the manner in which the invention is made and used. It should be understood that the implementation of other variations and modifications of the invention and its various aspects will be apparent to one skilled in the art, and that the invention is not limited by the specific embodiments described. Therefore, it is contemplated to cover the present invention and any and all modifications, variations, or equivalents that fall within the true spirit and scope of the basic underlying principles disclosed and claimed herein.

What is claimed is:

1. A method of constructing a temperature controlled crystal oscillator chip comprising the steps of:
    disposing a connection pad on a surface of the chip;
        providing a first circuit within the chip for control of a first function through a first interconnection with the connection pad; and
    providing a second circuit within the chip for control of a second function through a second interconnection with the connection pad,
    wherein the first function comprises providing a filtering connection to a power supply of the chip and the second function comprises coupling a programming voltage from the connection pad to a programmable memory.

2. The method of constructing a temperature controlled crystal oscillator chip as in claim 1 wherein the step of providing a filtering connection to a power supply of the chip further comprises providing a connection between a reference bus of the power supply and an external filtering capacitor through the connection pad.

3. A method of constructing a temperature controlled crystal oscillator chip comprising the steps of:
    disposing a connection pad on a surface of the chip;
    providing a first circuit within the chip for control of a first chip function through a first interconnection with the connection pad; and
    providing a second circuit within the chip for control of a second chip function through a second interconnection with the connection pad,
    wherein the first chip function further comprises synchronizing an internal clock of the chip with an external clock.

4. The method of constructing a temperature controlled crystal oscillator chip as in claim 3 wherein the second chip function further comprises programming an electrically programmable read only memory.

5. The method of constructing a temperature controlled crystal oscillator chip as in claim 4 wherein the step of programming an electrically programmable read only memory further comprises providing a microLAN interface between a controller of the electrically programmable read only memory and the connection pad.

6. The method of constructing a temperature controlled crystal oscillator chip as in claim 5 wherein the step of providing a microLAN interface between a controller of the electrically programmable read only memory and the connection pad further comprises detecting a RESET protocol through the microLAN interface.

7. The method of constructing a temperature controlled crystal oscillator chip as in claim 6 wherein the step of providing a microLAN interface between a controller of the electrically programmable read only memory and the connection pad further comprises detecting a chip select protocol through the microLAN interface.

8. The method of constructing a temperature controlled crystal oscillator chip as in claim 7 wherein the step of detecting a chip select protocol further comprises receiving a downloaded file.

9. The method of constructing a temperature controlled crystal oscillator chip as in claim 7 wherein the step of detecting a chip select protocol further comprises transmitting an uploaded file to the connection pad.

10. A method of constructing a temperature controlled crystal oscillator chip comprising the steps of:
   disposing a connection pad on a surface of the chip;
   providing a first circuit within the chip for control of a first function through a first interconnection with the connection pad; and
   providing a second circuit within the chip for control of a second function through a second interconnection with the connection pad,
   wherein the first function comprises coupling a frequency output signal of the chip to the connection pad for use by an external circuit and wherein the second function comprises programming an electrically programmable read-only memory.

11. A method of constructing a temperature controlled crystal oscillator chip comprising the steps of:
   disposing a connection pad on a surface of the chip;
   providing a first circuit within the chip for control of a first function through a first interconnection with the connection pad; and
   providing a second circuit within the chip for control of a second function through a second interconnection with the connection pad,
   wherein the first function further comprises adjusting an output frequency of the temperature controlled crystal oscillator, and
   wherein the second function further comprises coupling an external crystal oscillator to an internal Colpitts circuit.

12. A temperature controlled crystal oscillator chip comprising:
   a connection pad disposed on a surface of the chip;
   a first circuit within the chip having a first function through a first interconnection with the connection pad; and
   a second circuit within the chip having a second function through a second interconnection with the connection pad,
   wherein the first function comprises providing a filtering connection to a power supply of the chip and the second function comprises coupling a programming voltage from the connection pad to a programmable memory.

13. The temperature controlled crystal oscillator chip as in claim 12 wherein the function of providing a filtering connection to a power supply of the chip comprises a connection between a reference bus of the internal power supply and an external filtering capacitor through the connection pad.

14. A temperature controlled crystal oscillator chip comprising:
   a connection pad disposed on a surface of the chip;
   a first circuit within the chip having a first function through a first interconnection with the connection pad; and
   a second circuit within the chip having a second function through a second interconnection with the connection pad,
   wherein the first chip function includes synchronizing an internal clock of the chip with an external clock.

15. The temperature controlled crystal oscillator chip as in claim 14 wherein the second function includes programming an electrically programmable read-only memory.

16. The temperature controlled crystal oscillator chip as in claim 14 wherein the second function includes programming an electrically programmable read-only memory by providing a microLAN interface between a controller of the electrically programmable read-only memory and the connection pad.

17. The temperature controlled crystal oscillator chip as in claim 14 wherein the second function includes providing a microLAN interface between a controller of the electrically programmable read-only memory and the connection pad by detecting a RESET protocol through the microLAN interface.

18. The temperature controlled crystal oscillator chip as in claim 14 wherein the second function includes providing a microLAN interface between a controller of the electrically programmable read-only memory and the connection pad by detecting a chip select protocol through the microLAN interface.

19. A temperature controlled crystal oscillator chip comprising:
   a connection pad disposed on a surface of the chip;
   a first circuit within the chip having a first function through a first interconnection with the connection pad; and
   a second circuit within the chip having a second function through a second interconnection with the connection pad,
   wherein the first function includes selectively coupling a frequency output signal of the chip to an external circuit and wherein the second function comprises programming an electrically programmable read-only memory.

20. A temperature controlled crystal oscillator chip comprising:
   a connection pad disposed on a surface of the chip;
   a first circuit within the chip adapted to serve a first function through a first interconnection with the connection pad; and
   a second circuit within the chip adapted to serve a second function through a second interconnection with the connection pad,
   wherein the first circuit comprises a selectable filtering connection to a power supply of the chip and wherein the second circuit further comprises a matrix switch adapted to program an electrically programmable read-only memory.

21. A temperature controlled crystal oscillator chip comprising:
   a connection pad disposed on a surface of the chip;
   a first circuit within the chip adapted to serve a first chip function through a first interconnection with the connection pad; and
   a second circuit within the chip adapted to serve a second chip function through a second interconnection with the connection pad,
   wherein the first circuit further comprises a phase detector adapted to synchronize an internal clock of the chip with an external clock.

* * * * *